United States Patent
Fereyre et al.

(10) Patent No.: US 10,128,298 B2
(45) Date of Patent: Nov. 13, 2018

(54) COLOUR IMAGE SENSOR WITH WHITE PIXELS AND COLOUR PIXELS

(71) Applicant: Teledyne e2v Semiconductors SAS, Saint Egreve (FR)

(72) Inventors: Pierre Fereyre, Voreppe (FR); Frédéric Mayer, Voiron (FR); Pascal Douine, Voiron (FR); Thierry Ligozat, Quaix-en-Chartreuse (FR); Vincent Prevost, Seyssins (FR); Bruno Diasparra, Seyssins (FR)

(73) Assignee: TELEDYNE E2V SEMICONDUCTORS SAS, Saint Egreve (FR)

( * ) Notice: Subject to any disclaimer, the term of this patent is extended or adjusted under 35 U.S.C. 154(b) by 0 days.

(21) Appl. No.: 15/538,294

(22) PCT Filed: Dec. 16, 2015

(86) PCT No.: PCT/EP2015/080004
§ 371 (c)(1),
(2) Date: Jun. 21, 2017

(87) PCT Pub. No.: WO2016/102267
PCT Pub. Date: Jun. 30, 2016

(65) Prior Publication Data
US 2018/0006078 A1    Jan. 4, 2018

(30) Foreign Application Priority Data
Dec. 22, 2014   (FR) .................................. 14 63121

(51) Int. Cl.
*H01L 27/146* (2006.01)
*H01L 21/00* (2006.01)
*H01L 27/32* (2006.01)

(52) U.S. Cl.
CPC .. *H01L 27/14643* (2013.01); *H01L 27/14607* (2013.01); *H01L 27/14621* (2013.01); *H01L 27/14649* (2013.01); *H01L 27/3227* (2013.01)

(58) Field of Classification Search
CPC ..................... H01L 27/14643; H01L 27/14649
(Continued)

(56) References Cited

U.S. PATENT DOCUMENTS

| | | | |
|---|---|---|---|
| 5,453,611 A * | 9/1995 | Oozu | ................ H01L 27/14621 250/208.1 |
| 7,176,507 B2 * | 2/2007 | Ihara | ................. H01L 27/14603 257/233 |
| 2005/0173742 A1 | 8/2005 | Ihara | |

FOREIGN PATENT DOCUMENTS

| | | | |
|---|---|---|---|
| EP | 0605898 A1 | 7/1994 | |
| EP | 1630871 * | 4/2004 | ........... H01L 27/146 |
| EP | 1630871 A1 | 3/2006 | |

OTHER PUBLICATIONS

International Search Report and Written Opinion for PCT/EP2015/080004, dated Feb. 19, 2016.

* cited by examiner

*Primary Examiner* — Calvin Lee
(74) *Attorney, Agent, or Firm* — Pilloff & Passino LLP; Sean A. Passino; Rachel K. Pilloff

(57) ABSTRACT

The invention relates to color-image sensors. To benefit both from a good luminance resolution and a color accuracy that is not excessively degraded by the sensitivity of silicon to near-infrared radiation, the invention proposes to produce a mosaic of pixels comprising colored pixels (R), (G), (B), coated with color filters, which are distributed in the matrix, with white pixels (T) not coated with color filters and which are distributed in the matrix. The colored pixels include photodiodes constructed differently from the photodiodes of (Continued)

the white pixels, the different construction being such that the photodiodes of the colored pixels have a lower sensitivity to infrared radiation than the photodiodes of the white pixels.

20 Claims, 6 Drawing Sheets

(58) Field of Classification Search
USPC .............................. 438/69–71; 257/432–444
See application file for complete search history.

COLOUR IMAGE SENSOR WITH WHITE PIXELS AND COLOUR PIXELS

FIELD

The invention relates to electronic colour-image sensors including a matrix of photosensitive pixels measuring the amount of light that they receive. The most commonplace sensors were originally sensors realized in CCD technology and are increasingly often sensors comprising active pixels realized in MOS technology. The invention will be described with regard to active pixels realized in MOS technology.

DESCRIPTION OF THE PRIOR ART

An active pixel realized in MOS technology in general includes a photodiode made of silicon and a plurality of transistors allowing a quantity of electrical charges generated in the photodiode under the effect of illumination to be detected. The signal level detected in the pixel is transferred out of the matrix to read circuits, for example one read circuit per column of pixels, the read-out being carried out row by row in parallel on the various columns.

In order to allow a colour image to be taken with a single matrix of pixels, provision is generally made to deposit, above the pixels, on the side light enters, a mosaic of filters of different colours, most often what is called a Bayer mosaic including a regular arrangement of groups of four colour filters of the primary colours, namely a red filter, a blue filter and two green filters. Arrangements with filters of the complementary secondary colours cyan, magenta, and yellow are also possible.

The filters are produced using organic colour pigments. However, they have the drawback of greatly attenuating the amount of light received by the photodiodes of the sensor; a pixel covered with a red filter receives at most only 75% of the light received at red wavelengths, and likewise a pixel covered with a blue or green filter does not uniformly convert all the light emitted in the blue or in the green; this results from the fact that the transmission curve of the filter as a function of frequency is not rectangular but rather Gaussian and that the transmission peak is not 100%.

It results therefrom that, at a low light level, the pixels are no longer sensitive enough and the resulting image is not exploitable by eye.

It has been proposed in the prior art to form matrices that comprise both pixels coated with colour filters, which will be called coloured pixels below (red pixel, blue pixel, green pixel for example) in order to recall the presence of the colour filter, and pixels not coated with colour filters, which will be called white pixels below.

Thus, in case of low light, white pixels collect all the light and deliver the principal luminance information. The coloured pixels collect less light and deliver chrominance information. This chrominance information will have a lower resolution than with a matrix of Bayer filters, and a lower signal level than the level of the white pixels since it originates from pixels receiving less light, but this is a secondary drawback because the low-light luminance information is more important than chromatic exactitude. The greater the number of white pixels, the more accurately the luminance information will represent the luminance of the image.

Another problem conventionally encountered with mosaics of colour filters, most particularly the least expensive filters which are formed using organic pigments, is the fact that these filters are all very transparent to near-infrared rays, and more particularly in the wavelength band from 750 nanometers to 1100 nanometers. Silicon is sensitive to these wavelengths and generates electrical charges in proportion to the near-infrared radiation that it receives. These charges, generated in red, blue or green pixels, are not generated by the actual red or blue or green radiation that the pixel receives. These charges therefore generate, in these pixels, a signal portion that does not represent the actual colour of the scene observed by the sensor. In order to prevent the sensor from receiving this interfering infrared radiation, it has been proposed in the prior art to place, in front of the sensor, a bandstop optical filter that lets the light in the visible wavelengths pass but that blocks the near-infrared. Such a filter is expensive because it must effectively block the infrared while especially letting the red wavelength band pass.

It has also been proposed to distribute, in a conventional mosaic of red, green and blue coloured pixels, additional pixels that are what may be called black pixels, covered with a filter completely blocking visible wavelengths but letting the infrared pass. Such a filter may be produced using organic pigments just like the other filters, for example by superposing, in the location of the pixels in question, a red filter and a blue filter. If it is a Bayer mosaic that is modified, an individual group of pixels then comprises a red pixel, a blue pixel, two green pixels, and a black pixel; these pixels are near one another and receive substantially the same dose of infrared rays from the observed scene. From the signals produced by the red, green and blue pixels, which are affected by infrared radiation, is then subtracted a value issued from the black pixel located immediately beside and that receives only infrared radiation. This subtraction, which is carried out for all the pixels, eliminates the harmful influence of the infrared radiation on these pixels.

SUMMARY

The invention is based on the observation that matrices including coloured pixels and white pixels could be treated differently as the luminance produced by infrared rays and received by white pixels when they are present is not necessarily disadvantageous. Specifically, the radiation received by white pixels does not corrupt the colour accuracy, and conversely contributes to the representation of the overall luminescence of a scene, especially in the case of low light or when a higher signal level is desirable for the quality of the electronic image.

Therefore, the invention provides a colour-image sensor comprising a matrix of N active photosensitive pixels, a pixel including a photodiode in order to deliver an electrical signal function of the electrical charges generated in the photodiode by light, the matrix being covered with a mosaic of colour filters placed in correspondence with the pixels of the matrix in order to form pixels that are what are referred to as coloured pixels, the filters being of K different types corresponding to a number K of different colours at least equal to two, and the pixels of each colour being distributed in the matrix, with P pixels, P<N, that are what are referred to as white pixels, not covered with a colour filter and distributed in the matrix, characterized in that the photodiodes of the coloured pixels are constructed differently from the photodiodes of the white pixels, the photodiodes of the coloured pixels having, for infrared wavelengths, a coefficient of conversion of photons into electrical charges significantly lower than the conversion coefficient of the photodiodes of the white pixels for the same wavelengths.

Thus, without there necessarily being a need for black pixels and without there being any need to use a blanket infrared filter, which would needlessly reduce the luminance information delivered by the white pixels and which would be expensive, an image providing good quality luminance information, particularly at a low light level, and chrominance information not greatly degraded by infrared radiation, is produced.

There are a number of possible ways of making the photodiodes of the coloured pixels less sensitive to infrared radiation than the photodiodes of the white pixels. Generally, it is known that the shortest wavelengths are those that penetrate the least into silicon and that they therefore generate electrical charges at a small depth (100 to 300 nanometers for blue wavelengths); green and red wavelengths penetrate more deeply into silicon and generate charges at a depth that is a little larger (of as much as one micron typically); infrared wavelengths are those that penetrate the most deeply into silicon and generate charges up to a depth that may be clearly much higher (several microns for the near infrared).

Means are therefore provided for preventing light from producing useful charges (i.e. charges effectively recoverable by the photodiode in order to be read) beyond a certain depth from which practically only infrared rays penetrate. To do this, either the depth of the space-charge zone created in the silicon by reverse biasing of the photodiode may be limited, or a zone for collecting and removing the electrons generated at depth may be created. In the first case, the electrons created at depth outside of the space-charge zone of the photodiode of a pixel cannot be collected by the pixel and therefore do not form part of the useful charges of the pixel; specifically, these electrons recombine elsewhere than in the space-charge zone and do not migrate to the cathode of the photodiode. In the second case, the charges are collected and removed to a drain and not to the photodiode.

In one embodiment, the photodiodes are formed by an n-p junction between an n-doped local region and a p-doped active layer that is brought to a reference potential, the active layer having a depth H below the junction. The photodiodes of the coloured pixels include a $p^+$-type local region that is more highly doped than the p-doped active layer, this more highly doped local region decreasing to a value H' lower than H the depth of p-type active layer located directly below the junction and limiting to this depth H' the space-charge zone produced in operation by reverse biasing of the photodiode, and the white pixels not including such a $p^+$-type local region so that their space-charge zone may extend to a depth larger than H'.

In another embodiment, with the same type of photodiode for the white pixels, provision is made for the photodiodes of the pixels covered with colour filters to include an $n^+$-type buried local region located at a depth H" below the junction, which depth is such that the active layer located below the buried local region mainly receives infrared rays but no or practically no visible radiation, the buried local region being brought to a potential allowing the charges generated by infrared radiation below this region to be drained.

In this second embodiment, it may be desirable for the pixels covered with colour filters to be juxtaposed so that they touch via one side or if absolutely necessary via a corner in order to allow a continuity to be formed in the connection of the $n^+$ buried regions of the coloured pixels, said continuity extending as far as one edge of the matrix. Thus the $n^+$-type buried layers of all these pixels may be connected to one another and it is then easier to connect the $n^+$-type buried layer to a positive potential from the edge of the matrix. This makes it possible to avoid having to provide connection contacts inside the pixel. It is however also possible, even with white pixels separating the coloured pixels, to create a continuous $n^+$ buried layer by giving it a grid shape that encircles the white pixels without penetrating below the white pixels and that therefore does not significantly modify the construction and behaviour of the photodiode of these white pixels.

Various mosaic configurations are possible, one advantageous configuration being an arrangement of pixels in periodic groups of pixels consisting of a blue pixel, a red pixel, two green-filter pixels and X pixels without filters between two coloured pixels of a given row or of a given column of the matrix. X is higher than or equal to 1 and equal to 1, 2 or 3.

BRIEF DESCRIPTION OF THE DRAWINGS

Other features and advantages of the invention will become apparent on reading the following detailed description that is given with reference to the appended drawings, in which:

FIG. 3 shows an example of a prior-art mosaic allowing the influence of near-infrared radiation to be compensated for;

FIG. 4 shows the organization of a sensor according to invention;

FIG. 8 shows a plurality of advantageous configurations of the mosaic of pixels according to the invention; and FIG. 9 shows configurations furthermore incorporating black pixels sensitive only to infrared rays.

DETAILED DESCRIPTION

Figure 1:
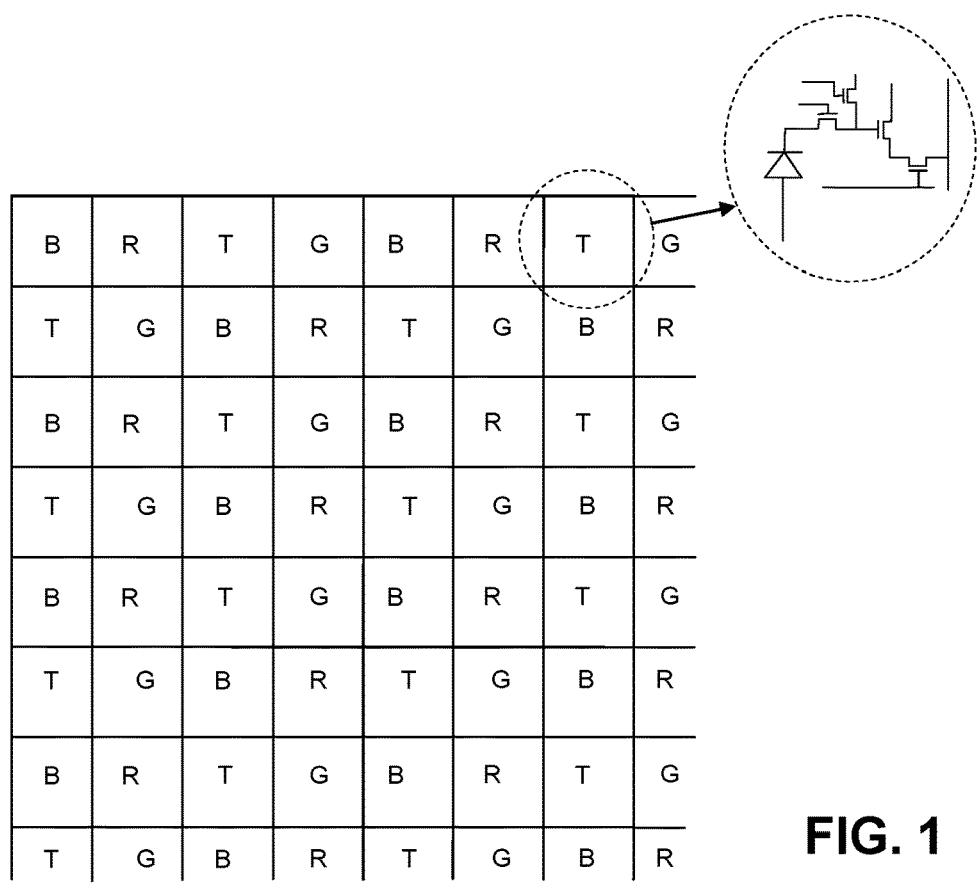
FIG. 1 schematically shows the organization of an electronic colour-image sensor comprising a silicon-based pixel matrix coated with a mosaic of colour filters with filterless pixels distributed in the matrix.

FIG. 1 shows, via a top view, the principle of a prior-art matrix array sensor. It comprises a matrix of rows and columns of photosensitive pixels. This matrix is covered with a mosaic of colour filters. In this example, there are both pixels that are what are called "coloured" pixels because they are covered with a filter of a given colour, and pixels that are what are called white pixels that are not covered with a colour filter. By way of example, a regular distribution of groups of four pixels that are respectively a red pixel (R) covered with a filter letting red light pass but not letting or almost not letting other colours pass, a blue pixel (B) covered with a filter letting blue light pass but not letting or almost not letting other colours pass, a green pixel (G) covered with a filter letting green light pass but not letting or almost not letting other colours pass, and a white pixel (T) not covered with a filter and therefore letting pass all the colours, has been shown. Other distributions of colours in the mosaic are known in the art, including distributions with filters of the complementary colours cyan, magenta and yellow instead of the primary colours red, blue and green.

The sensor is a silicon-based sensor that converts into electrical charges the light that it receives in a wavelength band extending from about 300 nanometers to about 1100 nanometers. Each pixel consists of a photodiode and a few transistors delivering an electrical signal representing the illumination received by the pixel. The filters are in general filters comprising organic colour pigments that mainly let pass wavelengths corresponding to the colour in question, namely: about 300 to 530 nanometers for the blue, 480 to 620 nanometers for the green, and about 580 to 650 nm for the red.

Figure 2:
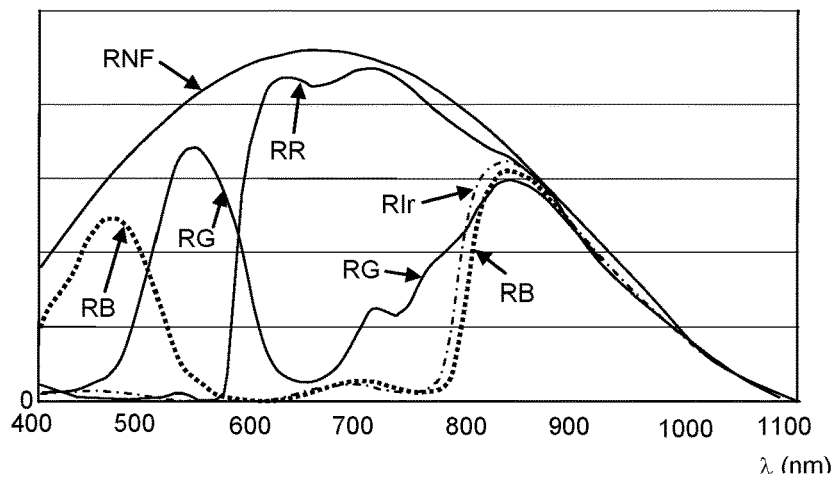
FIG. 2 shows an example of possible spectral responses of the pixels coated with colour filters.

FIG. 2 shows a graph of the typical sensitivity of a silicon sensor covered with organic colour filters.

Five different curves are shown in this graph. The x-axis represents wavelength; the y-axis is a sensitivity scale in arbitrary units, representing the output signal of a pixel for a given quantity of photons at the wavelength in question.

The curve RNF is the response curve of a white pixel, i.e. a pixel devoid of filter. It is representative of the intrinsic overall sensitivity of silicon. This curve has a maximum in the red and decreases on either side of this maximum. The other curves RB, RG, RR are the sensitivity curves of the blue, green and red pixels, respectively, and these curves therefore take into account the presence of a colour filter. These three curves exhibit a large sensitivity increase in the near-infrared domain: beyond about 820 nanometers, the filters are all practically transparent as they do not block these near-infrared wavelengths.

The near infrared therefore degrades the colour accuracy of the image by letting it be believed for example that a blue pixel is delivering a signal representing luminance for blue wavelengths, whereas the signal represents a sum of the blue luminance and infrared luminance received by the pixel.

An infrared filter placed in front of the sensor allows this drawback to be eliminated, but it is expensive.

Figures 3, 4:
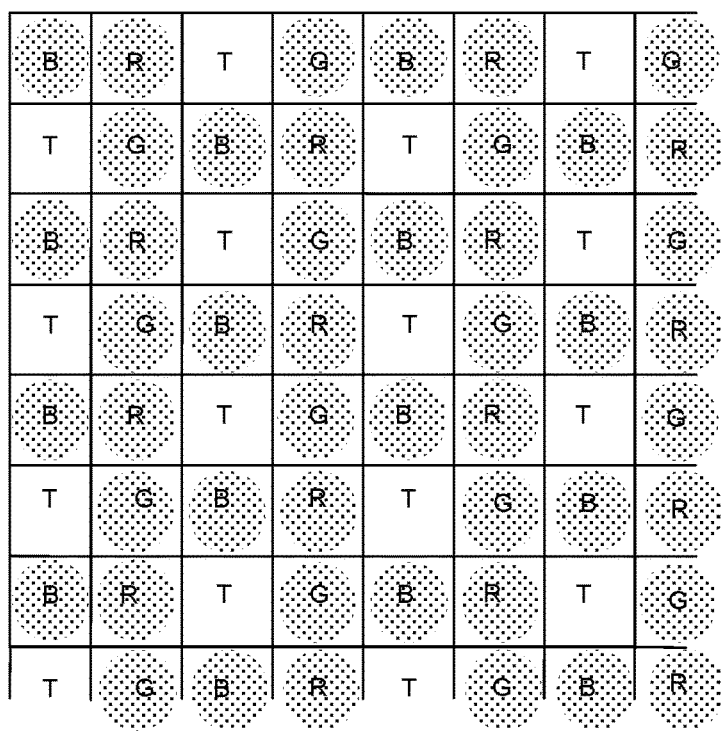

In the prior art, differently constructed mosaics of pixels, with a blue pixel (B), a green pixel (G), a red pixel (R) and what is called a "black" pixel (IR) that lets no colours pass and that lets only infrared radiation pass, have already been proposed. A black pixel may be produced by simply superposing a red filter and a blue filter; its response curve in FIG. 2 would be the curve RIr. FIG. 3 shows the organization of such a sensor. Each coloured pixel delivers a signal representing the sum of the luminance received in the colour in question and of the luminance received in the near-infrared. The black pixel delivers a signal representing only the luminance received in the near infrared. A subtraction between the signal issued from a coloured pixel and the signal issued from the closest black pixel eliminates the component associated with the infrared from the signal of the coloured pixel.

FIG. 4 shows the general organization of a sensor according to the invention, which is based on a different principle allowing the use of an infrared filter in front of the sensor to be avoided and allowing a mosaic of filters also including white pixels to be used in a way that maximizes the luminance of the white pixels. The mosaic of filters that covers the sensor may be the same as that in FIG. 1, i.e. it uses pixels (R), (G), (B) that are what are referred to as "coloured" pixels because they are covered with colour filters, and what are called "white" pixels (T) that are not covered with colour filters. Below, the case where the colours of the filters are the primary colours red, green and blue will be considered but alternatively provision could be made for filters of the secondary colours magenta, cyan and yellow.

The particularity of the invention is the fact that the coloured pixels are produced in silicon from photodiodes that have a different construction from the photodiodes of the white pixels. The white pixels have photodiodes that are quite highly sensitive to infrared radiation as in the prior art, but the coloured pixels are made with different photodiodes that are significantly less sensitive to infrared radiation. The photodiodes of the coloured pixels therefore have, at infrared wavelengths, a conversion coefficient (or more generally a response level as a function of wavelength) significantly lower than the photodiodes of the white pixels. The coloured pixels R, G, B are shown in FIG. 4 with a dotted disc-shaped area that symbolizes the fact that the photodiode of these pixels is different from the photodiode of the white pixels. The white pixels are shown without this dotted disc-shaped area and have a stronger response in the infrared domain.

The photodiodes of conventional sensors are in general formed by an n-p junction in an active layer of p-type single-crystal silicon. To obtain a lower conversion coefficient in the coloured pixels than in the white pixels, it is for example possible to limit the depth of the space-charge zone created by reverse biasing of the photodiode, or indeed it is possible to create in the active layer an intermediate zone for collecting and removing the electrons generated at depth in the active layer. The space-charge zone, also called the depletion zone, is the region devoid of free carriers that appears at an n-p junction, in particular when it is reverse biased. The extent of this zone on either side of the junction increases as the doping of the layer is decreased and as the reverse biasing voltage is increased. This zone, in which a non-zero electric field develops, allows a very high generated-charge collection efficiency to be obtained.

The n-p junction is formed between an n-doped local region and the p-doped active layer. The active layer is brought to a reference potential. All the conductivity types could be inverted without changing the nature of the invention and the definition given for one conductivity type will be considered to apply identically to the inverse type without departing from the scope of the invention.

Figure 5:
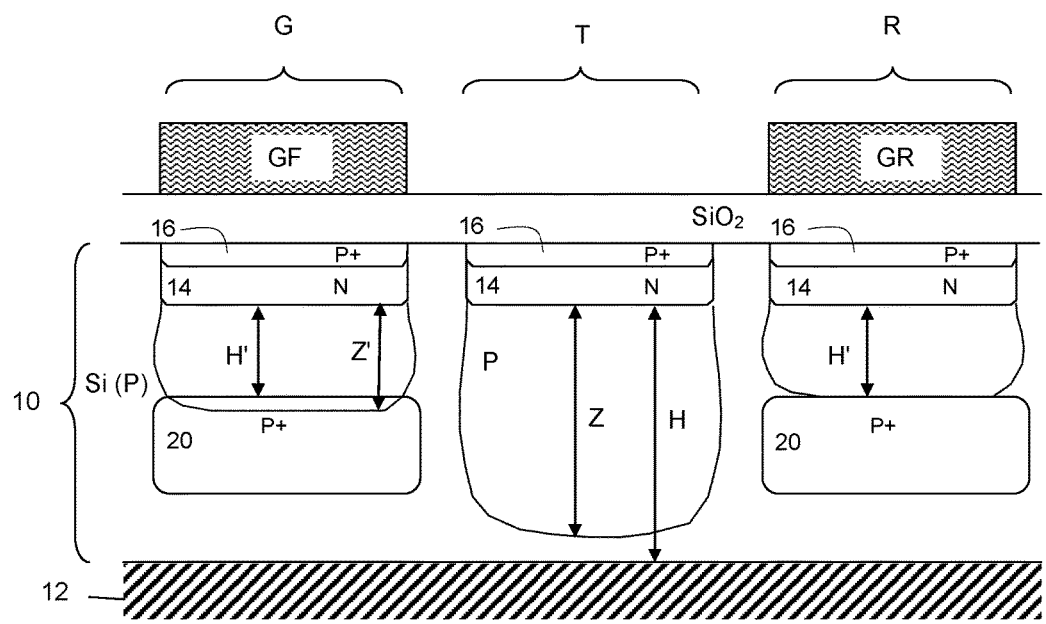
FIG. 5 shows a photodiode embodiment with attenuation of the influence of infrared on the coloured pixels.

FIG. 5 shows in cross section through the silicon of the sensor, the photodiodes of three adjacent pixels. The pixels are two red (R) and green (G) coloured pixels and a white pixel (T). Only the photodiodes are shown in order to simplify the drawing, the transistors of the pixels not being shown. The active layer 10 of single-crystal silicon in which the photodiodes are formed is a p-type active layer. It may be the top layer of a single-crystal silicon substrate or the top epitaxial layer of a silicon-on-insulator (SOI) substrate. The substrate 12 is represented simply by hatching in FIG. 5; its thickness is much larger than the thickness of the active layer 10, the latter possibly having a thickness of 3 microns to 30 microns.

The photodiodes are constructed with n-type individual regions 14 diffused into the active layer 10, which regions form, with the underlying silicon, an n-p junction. Conventionally but not obligatorily, each n region 14 may be covered with a $p^+$-type surface zone 16 that is brought to a reference potential that is the potential applied to the active layer 10. The pixels are active pixels and include transistors for reading the charges accumulated in the regions 14 in operation. The pixels are separated from one another by isolating regions consisting of silicon of the same type as the active layer 10 but more highly doped, the isolation optionally being reinforced by the presence of shallow trench isolations (STI) of silicon oxide. These zones are not shown; they prevent or limit the movement of electrical charges generated by the light from one pixel to a neighbouring pixel. Lastly, an insulating layer, for example made of silicon oxide $SiO_2$, may cover the entire surface of the photodiodes.

The photodiode of the green pixel is covered with a green filter GF and the photodiode of the red pixel is covered with a red filter GR. It may be seen that there is no filter above the photodiode of the white pixel T.

In this description, the term "photodiode" will be used to refer to the assembly made up of the n region 14 (optionally with its region 16) and the semiconductor regions located under the region 14.

In the embodiment in FIG. 5, the difference in the construction of the photodiodes of the white and coloured pixels is a difference that leads to a difference in the possible depthwise extension of the space-charge zone created in the active layer by reverse biasing of the photodiode. The possible extension of the space-charge zone (represented by a dotted line) is smaller in the coloured pixels, by virtue of the particular construction of the photodiode of these pixels, than in the white pixels. This extension depends on the doping of the semiconductor below the junction and depends on the reverse biasing voltage of the photodiode. However, the limit of the extension is made smaller in the coloured pixels than in the white pixels by virtue of a $p^+$-type deep layer that is more highly doped than the active layer.

In the example given in FIG. 5, the depth H of the active layer is considered to be about 3 to 10 microns and the space-charge zone is considered to occupy the entire depth, or practically the entire depth, of the active layer below white pixels. However, the depth H of the active layer could be different from the depth Z of the space-charge zone, in particular when the depth of the active layer is larger than 10 or 20 microns or more.

Provision is then made below the coloured pixels for a local region 20 of the same conductivity type as the active layer but more highly doped, limiting, to a depth Z' below the n-p junction, the extension of the space-charge zone produced in operation by reverse biasing of the photodiode of the pixel. The depth Z' is smaller than Z and in practice the top of the $p^+$ local region may be located at a depth H'=Z' below the junction, or a little above this depth if the $p^+$ local region is much more highly doped than the active layer. Specifically, the space-charge zone extends very little into a highly doped region. The extension of the space-charge zone is proportional to the square root of the inverse of the concentration of dopant atoms.

Radiation of blue, green and red visible wavelengths penetrates into the silicon and creates electrical charges in the depth Z'. This radiation does not penetrate any deeper or not much deeper. Infrared rays penetrate deeper, into the $p^+$ region 20 and beyond. If they create electrical charges in the $p^+$ region, these charges will rapidly recombine and the electrons are not attracted to the n region of the photodiode. If they create charges between the $p^+$ region 20 and the substrate 12, these charges may possibly disperse towards the neighbouring white pixels, but will not disperse towards the coloured pixels because of the $p^+$ regions 20, which hinder their passage towards the regions 14.

The photodiodes of the white pixels do not possess this $p^+$ region. Radiation of visible or near-infrared wavelength creates electrical charges throughout the depth Z of the space-charge zone, here practically throughout the depth of the active layer. The electrons drained by the electric field present in the space-charge zone may be collected by the n region 14 of the white pixel. All the received luminance contributes, whatever its wavelength, to the signal produced by the white pixel. The latter gives the best possible indication of luminance. There is a risk of reception of electrons generated by infrared rays originating from neighbouring coloured pixels, creating a risk of loss of luminance resolution, but this risk decreases as the ratio of the number of coloured pixels to the number of white pixels decreases. Configurations in which, to obtain a good luminance resolution, provision is made for many more white pixels than coloured pixels, will be described below.

Thus, as was desired, a matrix is produced in which, for infrared wavelengths, the photon to useful signal conversion coefficient is lower for the photodiodes of pixels coated with colour filters than for the photodiodes of white pixels.

Typically, the depth Z' may be comprised between 1 and 5 microns and preferably between 1 and 3 microns, the height difference Z-Z' preferably being larger than 2 microns and possibly even being from 10 to 20 microns in the case where the active layer consists simply of the upper portion of a single-crystal silicon substrate. The depth H' may be equal to Z'. The depth H is at least equal to Z but may be greatly larger in certain cases.

The doping of the $p^+$-type local region 20 (typically 1 to 10 times $10^{16}$ atoms/cm$^3$, corresponding to a resistivity of a few ohms-cm) is preferably at least 10 times and preferably at least 100 times higher than the doping of the p-type active layer (typically from 1 to 10 times $10^{14}$ atoms/cm$^3$, corresponding to a resistivity of a few tens of ohms-cm) so that the space-charge zone stops practically at the depth H' at the top of the $p^+$ region 20 and penetrates very little into the $p^+$ region.

The $p^+$-doped region may be produced by deep implantation of impurities of the same type as the impurities that dope the active layer, preferably boron. This implantation takes place before the implantations of the regions 14 and 16 of the photodiodes.

Figure 6:
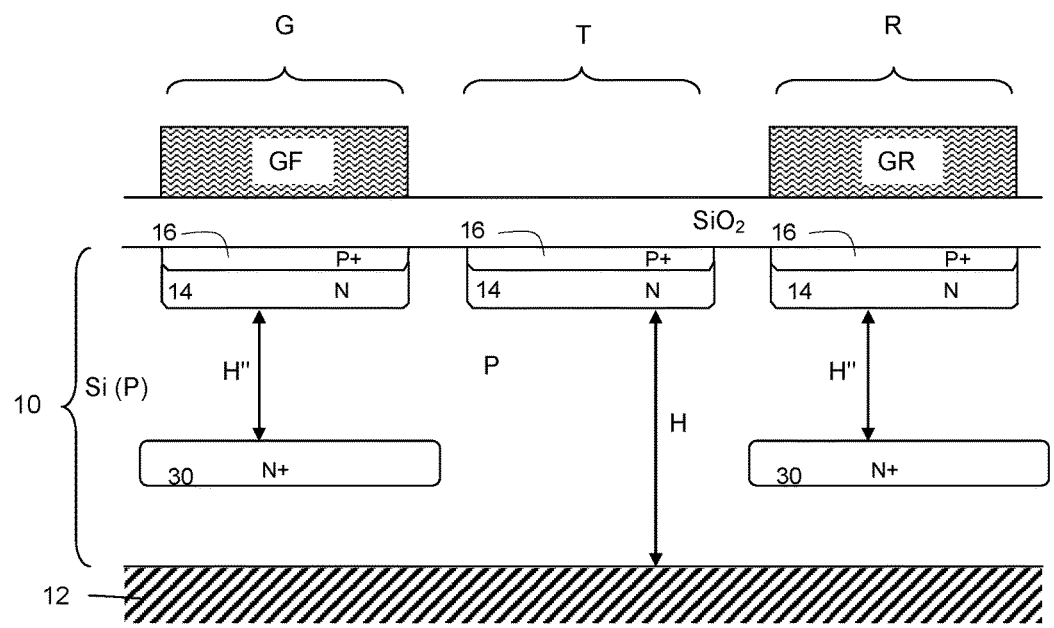
FIG. 6 shows another embodiment according to the invention.

FIG. 6 shows another exemplary embodiment leading to the same desired result, namely a photodiode response to infrared wavelengths (the response being the amount of electrical charges generated by a quantity of photons of a given wavelength and effectively recovered by the photodiode in order to deliver a useful signal for this wavelength) that is lower for coloured pixels than for white pixels, and this applying uniformly for all the coloured pixels.

In this embodiment, provision is made, in the photodiodes of the coloured pixels, not for a $p^+$ region that limits the depth of the space-charge zone, but for an $n^+$-type local region that is located at a depth H" and brought to a positive potential allowing electrons that are generated by light, at a depth at which it is essentially infrared rays and not visible rays that generate the electron-hole pairs, to be drained. This $n^+$ region 30 is brought to a fixed potential that may be the general supply potential Vdd or a potential that is lower, but higher than the reference potential of the active layer. The electrons are removed to this fixed potential.

Photons resulting from visible light are absorbed in the silicon at a smaller depth than the depth H" of the $n^+$ region and create electrons that are drained, as in the photodiodes of the white pixels, to the n region of the photodiode in order to deliver a useful signal. The infrared photons absorbed in proximity to the $n^+$ region 30 or in the $n^+$ region 30 or below the $n^+$ region 30 are removed and do not deliver a useful signal.

The photodiodes of the white pixels do not include this $n^+$ region 30.

As a result the electrical response for infrared wavelengths is again lower in coloured pixels than in white pixels.

To produce the deep n⁺ regions, it is possible to start with a substrate including a p-type epitaxial active layer of thickness H-H" smaller than the desired final thickness, i.e. smaller than the sum of the depth H and the depth of the zones 14 and 16. A mask is produced that protects the areas corresponding to the locations of the photodiodes of the white pixels and the desired n⁺ zones 30 are implanted into the surface of this partial layer, under the pixels that will be covered with colour filters. Next, the epitaxial growth of the entire height of the desired active layer is continued before forming the n and p⁺ regions of the photodiodes.

To avoid the need to make a contact connecting the n⁺ layer in each coloured pixel (for connection to the fixed drain potential), provision is preferably made for all the n⁺ regions 30 to be connected to one another, and a contact is made only on one or more exterior edges of the matrix. This may be achieved, in the case of FIG. 4, by making provision for the n⁺ region 30 of a coloured pixel to extend such that it touches the region of an adjacent coloured pixel.

It is also possible to do this in all the cases where the pixels touch via one side, or even only via one corner, by arranging for the n⁺ regions to touch on two adjacent sides or at two adjacent corners.

Figure 7:
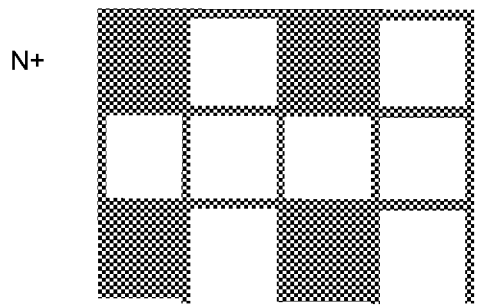
FIG. 7 shows one way of connecting the $n^+$ regions under the photodiodes of non-adjacent coloured pixels.

In addition, even if the edges or corners of the coloured pixels do not form a continuity extending to one edge of the matrix, it is still possible to form a continuity of n⁺ regions taking the form of a grid having apertures only in the location of the white pixels, as shown by way of example in FIG. 7. In this example (also usable in the embodiment in FIG. 5), the pixels are organized into elementary patterns of sixteen pixels comprising a red pixel, a blue pixel, two green pixels, and twelve white pixels. The coloured pixels are all separated from one another by a white pixel and their corners do not touch. It is then possible to form a grid of n⁺ regions as indicated in FIG. 7, below the illustrated mosaic; this grid includes continuous n⁺-zone areas below the coloured pixels G, R, B and apertured areas below the white pixels T, and connecting branches around the white pixels, these connecting branches being narrow enough that they have practically no effect on the white pixels.

Figure 8:
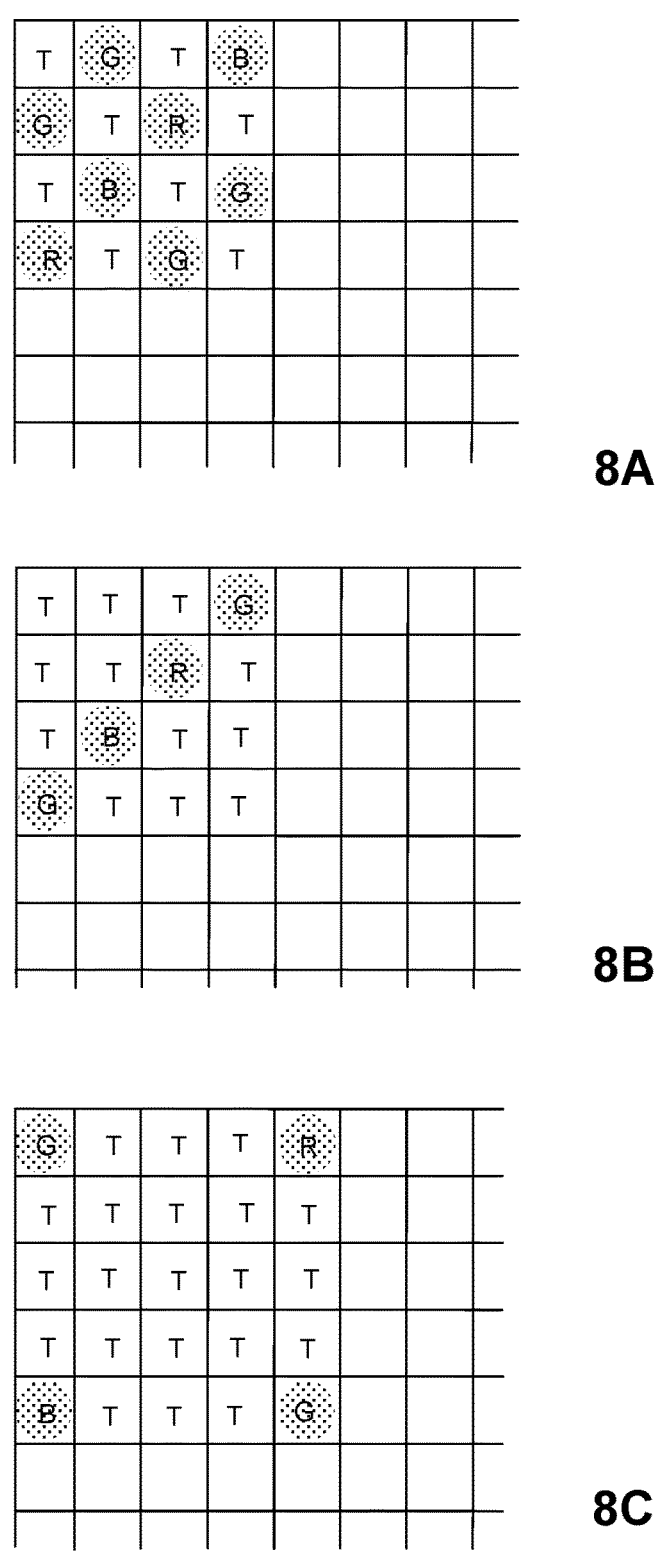

FIG. 8 shows various other arrangements of white and coloured pixels corresponding to different proportions of coloured pixels (50%, 25% and 6%, respectively). The higher the number of coloured pixels the higher the colour accuracy. The higher the number of white pixels, the higher the luminance resolution of the image. The mosaic 8A comprises a periodic repetition of squares of 16 pixels with 8 white pixels, four green pixels, two red pixels and two blue pixels. The mosaic 8B comprises a periodic pattern of squares of sixteen pixels with twelve white pixels and four coloured pixels (two green, one red and one blue, aligned along a diagonal of the square). The mosaic 8C comprises periodic squares of 25 pixels including four coloured pixels (two green, one red and one blue) and 21 white pixels, providing a very good luminance resolution.

In one variant embodiment, provision is made in the mosaic of colour filters for a distribution of black pixels each covered with a filter letting the near infrared pass and not letting visible light pass. These black pixels are produced with photodiodes that are identical to the photodiodes of the coloured pixels, i.e. with photodiodes that attenuate the influence of the near-infrared rays in the same way as for the coloured pixels. The signal issued from each coloured pixel and the signal issued from the closest black pixel (or an interpolation of the signals issued from the closest black pixels) are collected, and this signal is subtracted from the signal issued from the coloured pixel. However, no subtraction is carried out between the signal issued from the white pixels and the signals issued from the black pixels. This signal processing thus allows the colour accuracy of the coloured pixels to be improved without degrading the sensitivity of the white pixels. It may in practice be implemented in the sensor or by an external signal-processing circuit receiving the signals collected for each of the pixels of the matrix.

Figure 9:
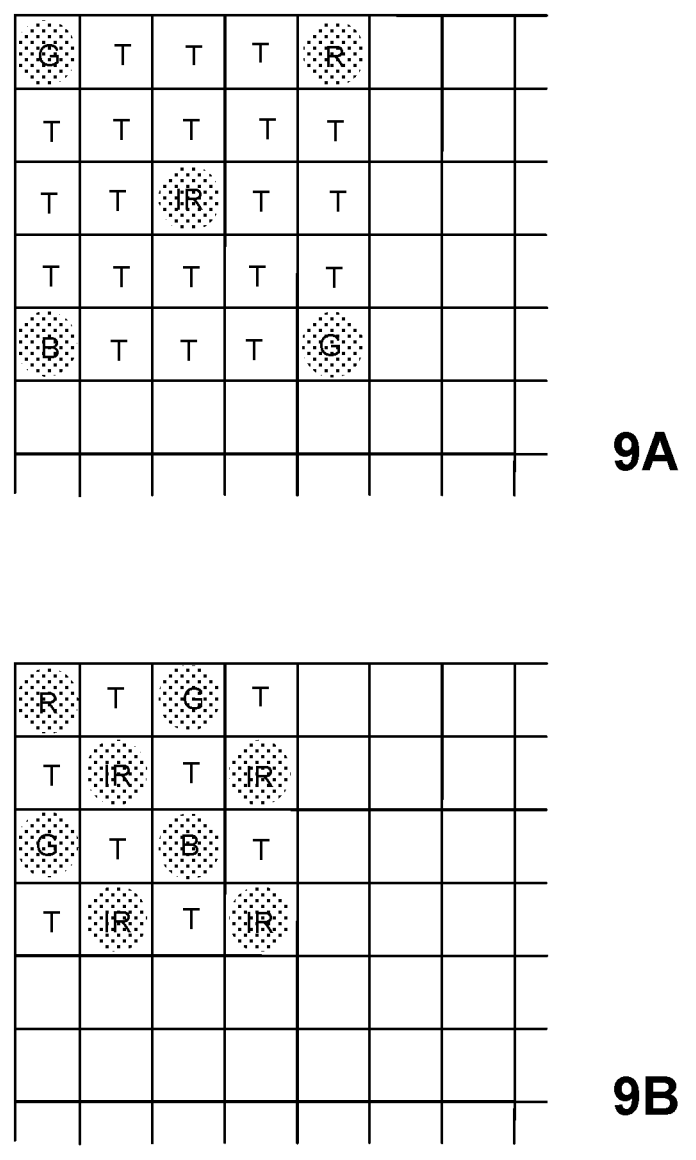

FIG. 9 shows two examples of embodiments of this variant. The first example (9A) is based on the embodiment in FIG. 8C, in which the white central pixel has been replaced by a black pixel IR. From the point of view of the present invention, the black pixel is considered to be a coloured pixel, coated with an infrared filter that may be produced by combining (superposition or mixture of pigments) a red filter and a blue filter. The second example (9B) comprises a larger proportion of black pixels, the elementary pattern repeated in the mosaic including eight white pixels, four coloured pixels and four black pixels, each black pixel being equidistant from four coloured pixels.

To end this description, it will be noted that the letters "n" and "p" have been used to refer to the conductivity types that conventionally correspond to doping with atoms of electron donor or acceptor impurities, respectively, but given that the conductivity types may all be inverted without changing anything as regards the principles of the invention, the references n and p are considered, for the purposes of this description and the claims, to be purely conventional and may designate dopants of opposite type to the usual case. The electrical charges collected are then no longer holes and the signs of the potential differences must be inverted. This notation was used to avoid complexifying the description with expressions such as "first conductivity type", "second conductivity type", "positive electrical charges", "negative electrical charges", etc.

The invention claimed is:

1. A colour-image sensor, comprising:
a matrix of N active photosensitive pixels, the matrix being covered with a mosaic of colour filters placed in correspondence with the matrix of pixels in order to form pixels that are what are referred to as coloured pixels coated with a colour filter, the filters being of K different types corresponding to a number K of different colours at least equal to two and the pixels of each colour being distributed in the matrix, the matrix furthermore comprising P pixels, P<N, that are distributed in the matrix and referred to as white pixels, being pixels not covered with a colour filter and exhibiting overall light photosensitivity, wherein each pixel of the matrix includes a photodiode in order to deliver an electrical signal function of the electrical charges generated in the photodiode by light; and wherein the photodiodes of the coloured pixels are constructed differently from the photodiodes of the white pixels, the photodiodes of the coloured pixels having, for infrared wavelengths, a coefficient of conversion of photons into electrical charges significantly lower than the conversion coefficient of the photodiodes of the white pixels for the same wavelengths.

2. The colour-image sensor of claim 1, in which the matrix includes an arrangement of pixels with filters of three different colours, especially a periodic arrangement of groups of pixels including a blue filter, a red filter and two green filters, and X (X>=1) white pixels between two coloured pixels of a given row or of a given column of the matrix.

3. The colour-image sensor of claim 2, wherein the matrix of pixels includes pixels that are what are called black pixels letting infrared rays but not visible light pass, said black pixels being distributed in the matrix, the photodiodes of these pixels being formed as the photodiodes of the coloured pixels, allowing the colour accuracy of the coloured pixels of the sensor to be improved by signal subtraction between a coloured pixel and the closest black pixel or a combination of the closest black pixels.

4. The colour-image sensor of claim 2, in which X is equal to 1 or 2 or 3.

5. The colour-image sensor of claim 4, wherein the matrix of pixels includes pixels that are what are called black pixels letting infrared rays but not visible light pass, said black pixels being distributed in the matrix, the photodiodes of these pixels being formed as the photodiodes of the coloured pixels, allowing the colour accuracy of the coloured pixels of the sensor to be improved by signal subtraction between a coloured pixel and the closest black pixel or a combination of the closest black pixels.

6. The colour-image sensor of claim 1, in which the photodiodes are formed by an n-p junction between an n-doped local region and a p-doped active layer that is brought to a reference potential, the active layer having a depth H below the junction, the photodiodes of the coloured pixels including a $p^+$-type local region that is more highly doped than the active layer, this more highly doped local region decreasing to a value H' lower than H the depth of p-type active layer located directly below the junction and limiting to this depth H' the space-charge zone produced in operation by reverse biasing of the photodiode, and the white pixels not including such a $p^+$-type local region so that their space-charge zone may extend to a depth larger than H'.

7. The colour-image sensor of claim 6, wherein the matrix of pixels includes pixels that are what are called black pixels letting infrared rays but not visible light pass, said black pixels being distributed in the matrix, the photodiodes of these pixels being formed as the photodiodes of the coloured pixels, allowing the colour accuracy of the coloured pixels of the sensor to be improved by signal subtraction between a coloured pixel and the closest black pixel or a combination of the closest black pixels.

8. The colour-image sensor of claim 6, in which the doping of the $p^+$-type local region is at least 10 times higher than the doping of the p-type active layer.

9. The colour-image sensor of claim 8, wherein the matrix of pixels includes pixels that are what are called black pixels letting infrared rays but not visible light pass, said black pixels being distributed in the matrix, the photodiodes of these pixels being formed as the photodiodes of the coloured pixels, allowing the colour accuracy of the coloured pixels of the sensor to be improved by signal subtraction between a coloured pixel and the closest black pixel or a combination of the closest black pixels.

10. The colour-image sensor of claim 6, in which the depth H' is comprised between 2 and 3 microns and the depth difference H-H' is larger than 2 microns.

11. The colour-image sensor of claim 10, wherein the matrix of pixels includes pixels that are what are called black pixels letting infrared rays but not visible light pass, said black pixels being distributed in the matrix, the photodiodes of these pixels being formed as the photodiodes of the coloured pixels, allowing the colour accuracy of the coloured pixels of the sensor to be improved by signal subtraction between a coloured pixel and the closest black pixel or a combination of the closest black pixels.

12. The colour-image sensor of claim 10, in which the doping of the $p^+$-type local region is at least 10 times higher than the doping of the p-type active layer.

13. The colour-image sensor of claim 1, in which the photodiodes are formed by an n-p junction between a n-doped local region and a p-doped active layer that is brought to a reference potential, the active layer having a depth H below the junction, the photodiodes of the pixels covered with colour filters including an $n^+$-type buried local region located at a depth H" below the junction, which depth is such that the active layer located below the buried local region mainly receives infrared rays but practically no visible radiation, the buried local region being brought to a potential allowing the charges generated by infrared radiation below this region to be drained, and the photodiodes of the pixels not covered with colour filters not including such an n-type buried local region.

14. The colour-image sensor of claim 13, wherein the matrix of pixels includes pixels that are what are called black pixels letting infrared rays but not visible light pass, said black pixels being distributed in the matrix, the photodiodes of these pixels being formed as the photodiodes of the coloured pixels, allowing the colour accuracy of the coloured pixels of the sensor to be improved by signal subtraction between a coloured pixel and the closest black pixel or a combination of the closest black pixels.

15. The colour-image sensor of claim 13, in which the coloured pixels are arranged in series so that they touch via one corner or via one side and the local buried $n^+$ regions form an $n^+$ doping continuity extending as far as one edge of the matrix.

16. The colour-image sensor of claim 15, wherein the matrix of pixels includes pixels that are what are called black pixels letting infrared rays but not visible light pass, said black pixels being distributed in the matrix, the photodiodes of these pixels being formed as the photodiodes of the coloured pixels, allowing the colour accuracy of the coloured pixels of the sensor to be improved by signal subtraction between a coloured pixel and the closest black pixel or a combination of the closest black pixels.

17. The colour-image sensor of claim 13, in which the depth H" of the $n^+$-type buried local region is at least 3 microns.

18. The colour-image sensor of claim 17, wherein the matrix of pixels includes pixels that are what are called black pixels letting infrared rays but not visible light pass, said black pixels being distributed in the matrix, the photodiodes of these pixels being formed as the photodiodes of the coloured pixels, allowing the colour accuracy of the coloured pixels of the sensor to be improved by signal subtraction between a coloured pixel and the closest black pixel or a combination of the closest black pixels.

19. The colour-image sensor of claim 17, in which the coloured pixels are arranged in series so that they touch via one corner or via one side and the local buried $n^+$ regions form an $n^+$ doping continuity extending as far as one edge of the matrix.

20. A colour-image sensor, comprising:
a matrix of N active photosensitive pixels, the matrix being covered with a mosaic of colour filters placed in correspondence with the matrix of pixels in order to form pixels that are what are referred to as coloured pixels coated with a colour filter, the filters being of K different types corresponding to a number K of different colours at least equal to two and the pixels of each colour being distributed in the matrix, the matrix furthermore comprising P pixels, P<N, that are distributed in the matrix and referred to as white pixels, being pixels not covered with a colour filter and exhibiting overall light photosensitivity, wherein:

each pixel of the matrix includes a photodiode in order to deliver an electrical signal function of the electrical charges generated in the photodiode by light;

the photodiodes of the coloured pixels are constructed differently from the photodiodes of the white pixels, the photodiodes of the coloured pixels having, for infrared wavelengths, a coefficient of conversion of photons into electrical charges significantly lower than the conversion coefficient of the photodiodes of the white pixels for the same wavelengths; and wherein the matrix of pixels further includes pixels that are what are called black pixels letting infrared rays but not visible light pass, said black pixels being distributed in the matrix, the photodiodes of these pixels being formed as the photodiodes of the coloured pixels, allowing the colour accuracy of the coloured pixels of the sensor to be improved by signal subtraction between a coloured pixel and the closest black pixel or a combination of the closest black pixels.

* * * * *